United States Patent
Karpov et al.

(10) Patent No.: US 10,868,246 B2
(45) Date of Patent: Dec. 15, 2020

(54) CONDUCTIVE BRIDGE RANDOM ACCESS MEMORY (CBRAM) DEVICES WITH LOW THERMAL CONDUCTIVITY ELECTROLYTE SUBLAYER

(71) Applicant: Intel Corporation, Santa Clara, CA (US)

(72) Inventors: Elijah V. Karpov, Portland, OR (US); Roza Kotlyar, Portland, OR (US); Prashant Majhi, San Jose, CA (US); Jeffery D. Bielefeld, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/320,010

(22) PCT Filed: Sep. 30, 2016

(86) PCT No.: PCT/US2016/054748
§ 371 (c)(1),
(2) Date: Jan. 23, 2019

(87) PCT Pub. No.: WO2018/063320
PCT Pub. Date: Apr. 5, 2018

(65) Prior Publication Data
US 2019/0229264 A1    Jul. 25, 2019

(51) Int. Cl.
*G11C 13/00*  (2006.01)
*H01L 27/24*  (2006.01)
*H01L 45/00*  (2006.01)

(52) U.S. Cl.
CPC .......... *H01L 45/08* (2013.01); *G11C 13/0011* (2013.01); *H01L 27/2436* (2013.01);
(Continued)

(58) Field of Classification Search
CPC . H01L 45/08; H01L 27/2463; H01L 45/1233; H01L 45/085; H01L 45/1266;
(Continued)

(56) References Cited

U.S. PATENT DOCUMENTS

| | | | |
|---|---|---|---|
| 8,426,839 B1 * | 4/2013 | Ma ...................... | H01L 45/1233 257/4 |
| 2003/0161195 A1 * | 8/2003 | Zonca ................ | G11C 13/0069 365/200 |

(Continued)

OTHER PUBLICATIONS

International Preliminary Report on Patentability for International Patent Application No. PCT/US2016/054748 dated Apr. 11, 2019, 11 pgs.

(Continued)

*Primary Examiner* — Edward Chin
(74) *Attorney, Agent, or Firm* — Schwabe, Williamson & Wyatt, P.C.

(57) ABSTRACT

Conductive bridge random access memory (CBRAM) devices with low thermal conductivity electrolyte sublayers are described. In an example, a conductive bridge random access memory (CBRAM) device includes a conductive interconnect disposed in an inter-layer dielectric (ILD) layer disposed above a substrate. The CBRAM device also includes a CBRAM element disposed on the conductive interconnect. The CBRAM element includes an active electrode layer disposed on the conductive interconnect, and a resistance switching layer disposed on the active electrode layer. The resistance switching layer includes a first electrolyte material layer disposed on a second electrolyte material layer, the second electrolyte material layer disposed on the active electrode layer and having a thermal conductivity lower than a thermal conductivity of the first electrolyte material layer. A passive electrode layer is disposed on the first electrolyte material of the resistance switching layer.

23 Claims, 11 Drawing Sheets

(52) U.S. Cl.
CPC ........ *H01L 27/2463* (2013.01); *H01L 45/085* (2013.01); *H01L 45/1233* (2013.01); *H01L 45/1266* (2013.01); *H01L 45/141* (2013.01); *H01L 45/142* (2013.01); *H01L 45/144* (2013.01); *H01L 45/145* (2013.01); *H01L 45/146* (2013.01); *H01L 45/1616* (2013.01); *H01L 45/1625* (2013.01); *G11C 2013/0073* (2013.01); *G11C 2213/33* (2013.01); *G11C 2213/34* (2013.01); *G11C 2213/35* (2013.01); *G11C 2213/56* (2013.01); *G11C 2213/79* (2013.01)

(58) Field of Classification Search
CPC ............. H01L 27/2436; H01L 45/1625; H01L 45/142; H01L 45/145; H01L 45/144; H01L 45/141; H01L 45/1616; H01L 45/146; G11C 13/0011; G11C 2213/35; G11C 2213/79; G11C 2213/33; G11C 2013/0073; G11C 2213/34; G11C 2213/56

See application file for complete search history.

(56) References Cited

U.S. PATENT DOCUMENTS

| | | |
|---|---|---|
| 2011/0121254 A1 | 5/2011 | Dressler et al. |
| 2013/0148302 A1 | 6/2013 | Ben Jamaa et al. |
| 2015/0194602 A1* | 7/2015 | Liao ........................ H01L 45/08 257/4 |

OTHER PUBLICATIONS

International Search Report and Written Opinion for International Patent Application No. PCT/US2016/054748 dated Apr. 25, 2017, 14 pgs.

* cited by examiner

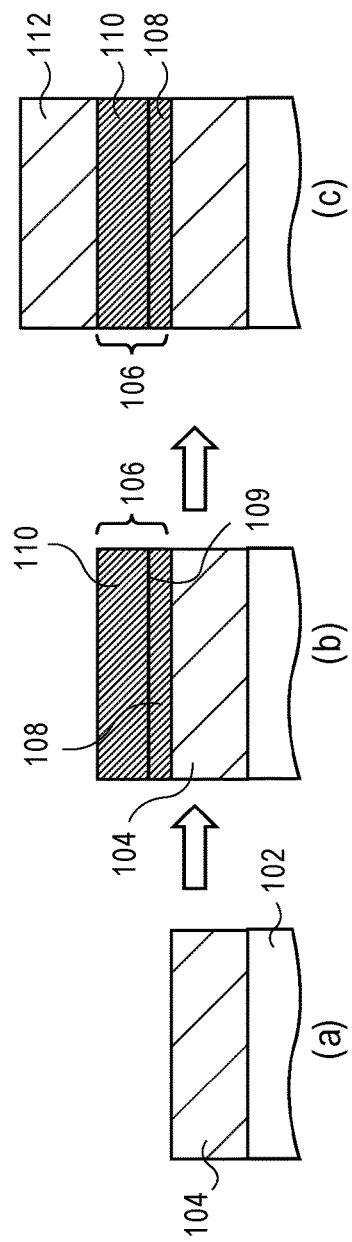
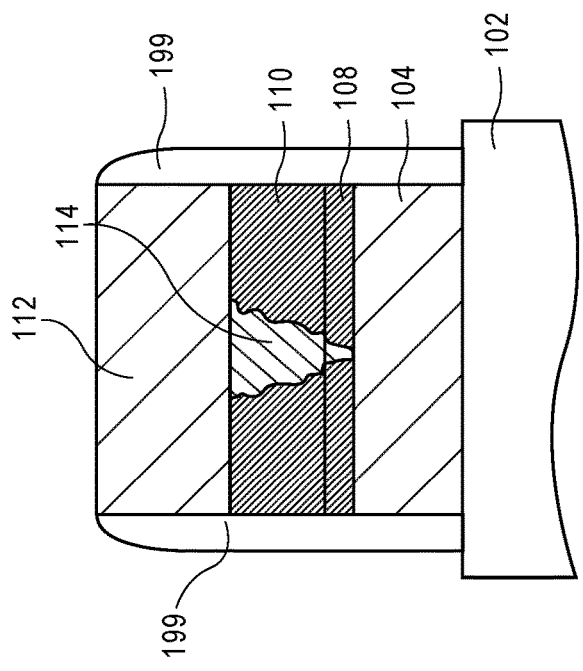
FIG. 3
FIG. 4

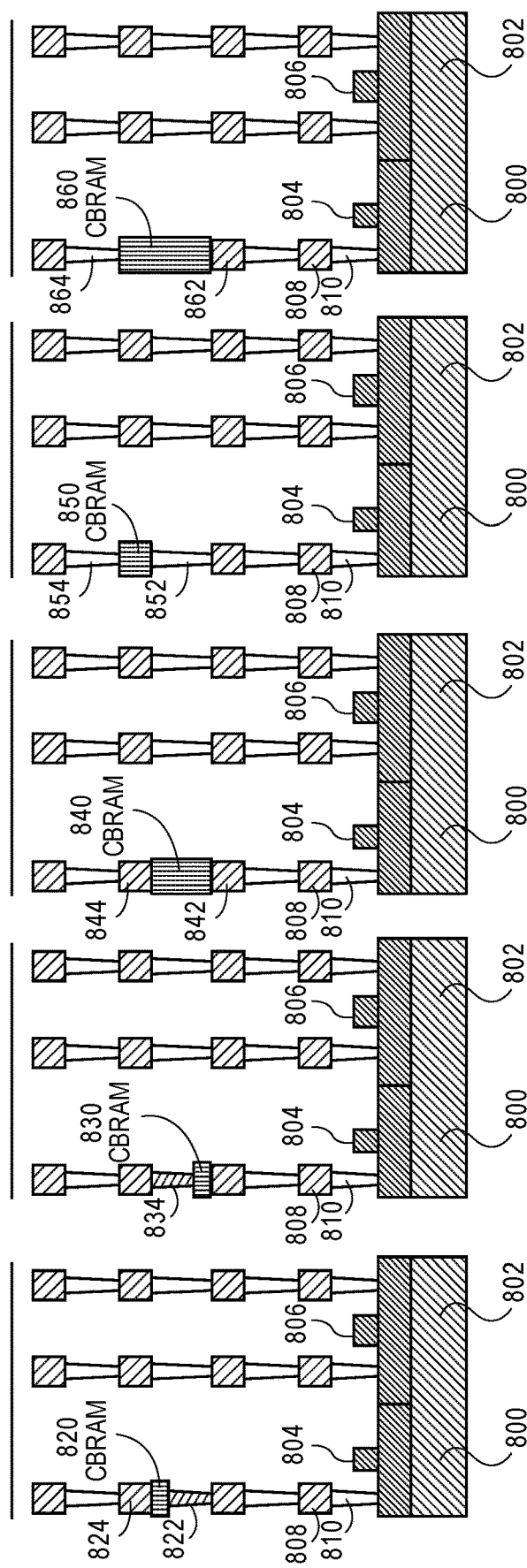

CONDUCTIVE BRIDGE RANDOM ACCESS MEMORY (CBRAM) DEVICES WITH LOW THERMAL CONDUCTIVITY ELECTROLYTE SUBLAYER

CROSS-REFERENCE TO RELATED APPLICATION

This patent application is a U.S. National Phase Application under 35 U.S.C. § 371 of International Application No. PCT/US2016/054748, filed Sep. 30, 2016, entitled "CONDUCTIVE BRIDGE RANDOM ACCESS MEMORY (CBRAM) DEVICES WITH LOW THERMAL CONDUCTIVITY ELECTROLYTE SUBLAYER," which designates the United States of America, the entire disclosure of which is hereby incorporated by reference in its entirety and for all purposes.

TECHNICAL FIELD

Embodiments of the invention are in the field of integrated circuit fabrication and, in particular, conductive bridge random access memory (CBRAM) devices with low thermal conductivity electrolyte sublayers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on resistance change is known as RRAM or ReRAM. Although commonly anticipated as a replacement technology for flash memory, the cost benefit and performance benefit of RRAM have not been obvious enough to most companies to proceed with the replacement. Also, for low voltage non-volatile embedded applications, operating voltages less than 1V and compatible with CMOS logic processes may be desirable but challenging to achieve.

Thus, significant improvements are still needed in the area of nonvolatile memory device manufacture and operation. In particular, significant improvements are still needed in the area of non-volatile memory arrays and their integration with logic processors.

BRIEF DESCRIPTION OF THE DRAWINGS

FIG. 3 illustrates cross-sectional views of various operations in a method of fabricating a CBRAM element, in accordance with an embodiment of the present invention.

FIG. 4 illustrates a cross-sectional view of a patterned CBRAM element having a dielectric spacer, in accordance with another embodiment of the present invention.

FIGS. 8A-8E illustrate schematic views of several options for positioning a CBRAM element in an integrated circuit, in accordance with embodiments of the present invention.

DESCRIPTION OF THE EMBODIMENTS

Figure 1:
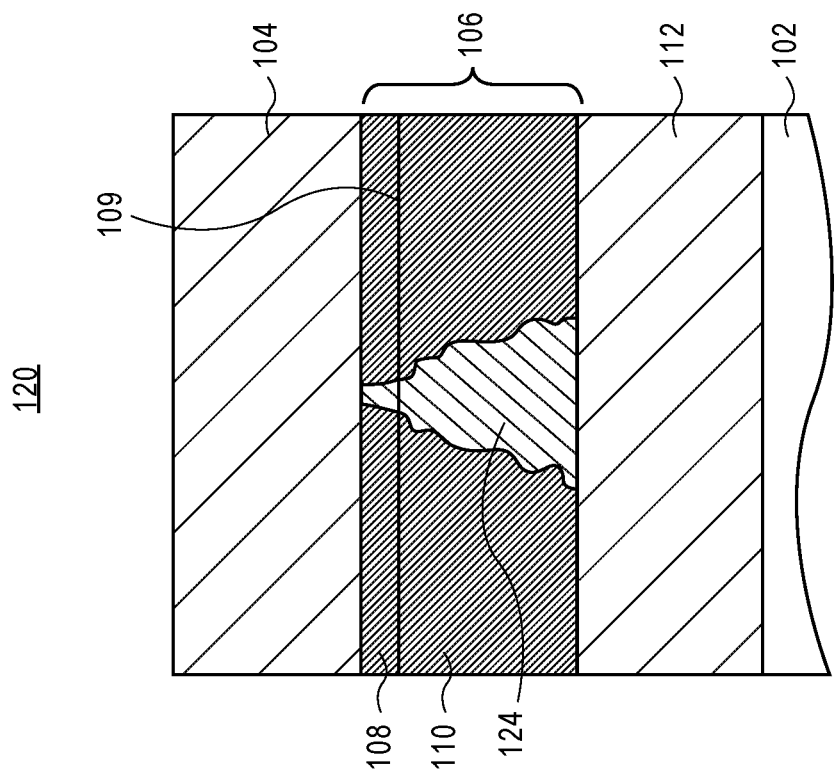
FIG. 1 illustrates a cross-sectional view of a CBRAM element having a low thermal conductivity electrolyte sublayer, in accordance with an embodiment of the present invention.

Conductive bridge random access memory (CBRAM) devices with low thermal conductivity electrolyte sublayers are described. In the following description, numerous specific details are set forth, such as specific CBRAM material regimes and structure architectures, in order to provide a thorough understanding of embodiments of the present invention. It will be apparent to one skilled in the art that embodiments of the present invention may be practiced without these specific details. In other instances, well-known features, such as operations associated with embedded memory, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper," "lower," "above," "below," "bottom," and "top"

refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In accordance with embodiments of the present invention, a CBRAM material stack is designed to improve the switching properties and reliability of a memory device based on the CBRAM material stack. It is to be appreciated that CBRAM may be viewed as a specific type of resistive random access memory (RRAM). In a CBRAM device, a filament is formed based on metallic migration into an electrolyte material which is the switching layer of the CBRAM device. By contrast, in conventional RRAM, a filament is created based on oxygen vacancies.

One or more embodiments are directed to conductive bridge random access memory (CBRAM) material stacks having a low thermal conductivity electrolyte sublayer. Particular embodiments are directed to the fabrication of low voltage (low V) and low programming current CBRAM using a low thermal conductivity sublayer in a solid electrolyte switching layer. Embodiments may be implemented to enable low V and low programming current metal filament memory by including a low thermal conductivity sub-layer in a solid electrolyte next to a copper (Cu), silver (Ag) or other active electrode. The use of such a dual layer solid electrolyte (SE) may effect reduced heat loss from the filament. To provide context, for a typical metal filament in a solid electrolyte, the device Joule heat is dissipated through the solid electrolyte when high current is passed through the device.

More generally, one or more embodiments of the present invention are directed to methods for integrating CBRAM memory arrays into a logic processor. Particular embodiments may be suitable for fabricating embedded non-volatile memory (e-NVM). Approaches described herein may provide a fabrication pathway for high performance CBRAM cells and increase the potential of using scaled CBRAM cells for future e-NVM needs, such as for integration in system on chip (SoC) products.

As an exemplary implementation, FIG. 1 illustrates a cross-sectional view of a CBRAM element having a low thermal conductivity electrolyte sublayer, in accordance with an embodiment of the present invention.

Referring to FIG. 1, a conductive bridge random access memory (CBRAM) device 100 includes an active electrode layer 104 disposed above a substrate 102, which may include a conductive interconnect underlying the CBRAM device 100. A resistance switching layer 106 is disposed on the active electrode layer 104. The resistance switching layer 106 includes a first electrolyte material layer 110 disposed on a second electrolyte material layer 108. The second electrolyte material layer 108 is disposed on the active electrode layer 104. In some instances, the second electrolyte material layer 108 is referred to as a sub-layer of a solid electrolyte of the switching layer 106. A passive electrode layer 112 is disposed on the first electrolyte material 110 of the resistance switching layer 106.

It is to be appreciated that the ordering of an active electrode and a passive electrode can be reversed with respect to an underlying substrate. As an example, FIG. 2 illustrates a cross-sectional view of another CBRAM element having a low thermal conductivity electrolyte sublayer, in accordance with another embodiment of the present invention.

Figure 2:
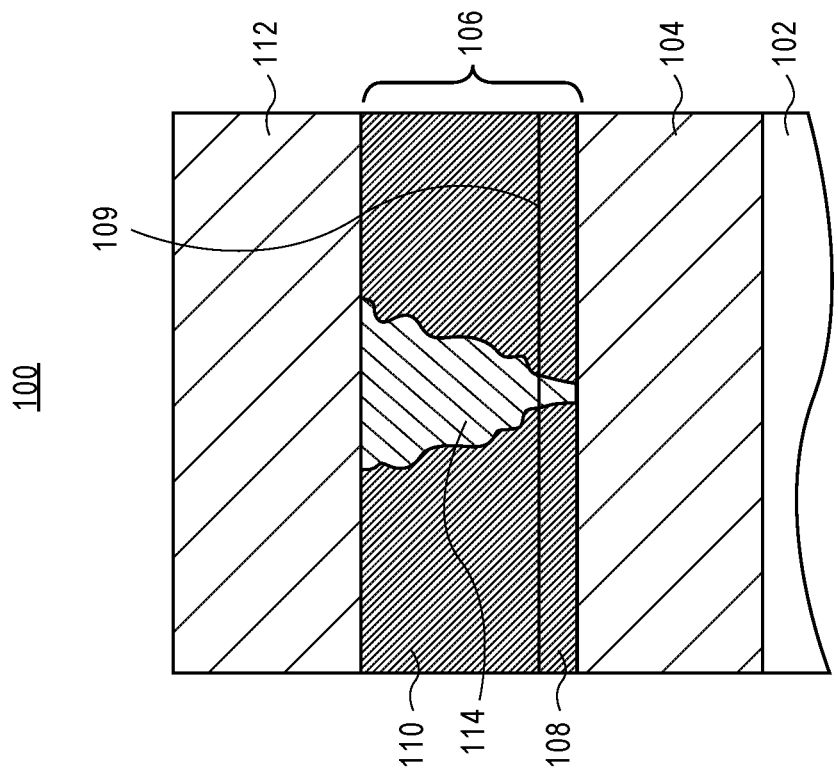
FIG. 2 illustrates a cross-sectional view of another CBRAM element having a low thermal conductivity electrolyte sublayer, in accordance with another embodiment of the present invention.

Referring to FIG. 2, a conductive bridge random access memory (CBRAM) device 120 includes a passive electrode layer 112 disposed above a substrate 102, which may include a conductive interconnect underlying the CBRAM device 120. A resistance switching layer 106 is disposed on the passive electrode layer 112. The resistance switching layer 106 includes a second electrolyte material layer 108 disposed on a first electrolyte material layer 110. The first electrolyte material layer 110 is disposed on the passive electrode layer 112. An active electrode layer 104 is disposed on the second electrolyte material 108 of the resistance switching layer 106.

Referring again to FIGS. 1 and 2, and as used throughout the present disclosure, in an embodiment, the second electrolyte material layer 108 has a thermal conductivity lower than a thermal conductivity of the first electrolyte material layer 110. In one such embodiment, the thermal conductivity of the second electrolyte material layer 108 is at least approximately 25% less than the thermal conductivity of the first electrolyte material layer 110. In another such embodiment, the thermal conductivity of the first electrolyte material layer 110 is at least approximately 50% greater than the thermal conductivity of the second electrolyte material layer 108. In an embodiment, the thermal conductivity of the second electrolyte material layer 108 is less than 0.5 W/m/K, and the thermal conductivity of the first electrolyte material layer 110 is greater than 0.5 W/m/K.

In an embodiment, the resistance switching layer 106 includes a seam 109 between the first electrolyte material layer 110 and the second electrolyte material layer 108, as is depicted in FIGS. 1 and 2. Such an arrangement may be referred to as a CBRAM stack having a first electrolyte material layer 110 separate and distinct from second electrolyte material layer 108. In other embodiments, there is no detectable or visible seam between the first electrolyte material layer 110 and the second electrolyte material layer 108. In an embodiment, the first electrolyte material layer 110 has a thickness greater than a thickness of the second electrolyte material layer 108, as is depicted in FIGS. 1 and 2. In one such embodiment, the thickness of the first electrolyte material layer 110 is approximately in the range of 2-5 nanometers, and the thickness of the second electrolyte material layer 108 is approximately in the range of 0.5-3 nanometers.

Referring again to FIGS. 1 and 2, and as used throughout the present disclosure, in an embodiment, the first electrolyte material layer 110 is a metal oxide or silicon oxide material. In one such embodiment, the first electrolyte material layer 110 is a silicon oxide. In another such embodiment, the first electrolyte material 110 is a metal oxide material such as, but not limited to, hafnium oxide. In an embodiment, the second electrolyte material layer 108 includes a material such as, but not limited to, carbon-doped silicon oxide, a low density or porous oxide, chalcogenide material which includes a group 6 element selected from the group consisting of Te, Se, and S. In one embodiment, the chalcogenide material is one such as, but not limited to, $Ge_xTe_y$ or $Ge_xS_y$, or anorthite $(CaAl_2Si_2O_8)$. In a specific embodiment, the first electrolyte material layer 110 includes a hafnium oxide material, and the second electrolyte material layer 108 includes a substoichiometric oxide of hafnium having a lower density/lower oxidation number than the hafnium oxide material of the first electrolyte material layer 110.

Referring again to FIGS. 1 and 2, and as used throughout the present disclosure, in an embodiment, the active electrode layer 104 is a source of cations for filament formation or resistance change in the switching layer 106. In an embodiment, the active electrode layer 104 includes a metal species such as, but not limited to, copper, silver, or lithium. In one embodiment, the active electrode layer 104 is composed of copper telluride. In one embodiment, the active electrode layer 104 is composed of silver telluride Referring again to FIGS. 1 and 2, and as used throughout the present disclosure, in an embodiment, the passive electrode layer 112 is not a source of cations for filament formation or resistance change in the switching layer 106. In an embodiment, the passive electrode layer 112 includes a metal species such as, but not limited to, tungsten or platinum. In one embodiment, a metal nitride, such as a titanium nitride or a tantalum nitride layer, is used as the material for the passive electrode layer 112. In another embodiment, the passive electrode layer 112 is composed of a noble metal such as, but not limited to Pd or Pt.

In an embodiment, referring again to FIG. 1 or FIG. 2, a filament 114 or a filament 124, respectively, is included or is formed in the resistance switching layer 106, e.g., in both the second electrolyte material layer 108 and the first electrolyte material layer 110, to provide a filament-based CBRAM device, as is described in greater detail below in association with FIGS. 9A and 9B. In one embodiment, the CBRAM device 100 or 120 includes only a single filament 114 or 124, respectively. In one such embodiment, the single filament 114 or 124 is disposed in the central portion of the electrolyte material stack 110/108. In other embodiments, however, a filament is not included and surface or interface-based CBRAM is fabricated. As such, embodiments described herein are applicable to both filamentary and interfacial CBRAM implementations.

A material stack for device 100 (or, alternatively, a material stack for device 120) may be fabricated by first performing a series of deposition operations. As an example, FIG. 3 illustrates cross-sectional views of various operations in a method of fabricating a CBRAM element, in accordance with an embodiment of the present invention.

Referring to part (a) of FIG. 3, a method of fabricating a conductive bridge random access memory (CBRAM) device includes forming a first electrode layer 104 above a substrate 102, which may include an underlying conductive interconnect, as is described in greater detail below. In the embodiment shown, the first electrode layer 104 is an active electrode layer. A resistance switching layer 106 is then formed on the first electrode layer 104, as is depicted in part (b) of FIG. 3. Referring to part (c) of FIG. 3 a second electrode layer 112 is formed on the resistance switching layer 106, e.g., on the first electrolyte material layer 110 of the resistance switching layer 106. In the embodiment shown, the second electrode layer 112 is a passive electrode layer.

In an embodiment, referring again to part (b) of FIG. 3, the resistance switching layer 106 is formed to include a bottom electrolyte material layer 108 and a top electrolyte material layer 110, the top electrolyte material layer 110 formed on the bottom electrolyte material layer 108. In one embodiment, the bottom electrolyte material layer 108 is formed on an active electrode layer and has a thermal conductivity lower than a thermal conductivity of the top electrolyte material layer 110. In a specific embodiment, the bottom electrolyte material layer 108 (the electrolyte material layer having the relatively lower thermal conductivity) of the resistance switching layer 106 is formed using atomic layer deposition (ALD) or chemical vapor deposition (CVD). The top electrolyte material layer 110 (the electrolyte material layer having the relatively higher thermal conductivity) is formed using physical vapor deposition (PVD).

In an embodiment, the material stack of part (c) of FIG. 3 is subsequently patterned to form a CBRAM device. In one such embodiment, the patterning is performed using a subtractive etching process, the resulting structure of which is described in greater detail below in association with FIGS. 4 and 5A. In another embodiment, the patterning is performed using a planarization operation of a damascene process, the resulting structure of which is described in greater detail below in association with FIG. 6.

Subsequent to the processing described in association with FIG. 3, dielectric spacer formation and/or filament formation may be performed. For example, FIG. 4 illustrates a cross-sectional view of a patterned CBRAM element having a dielectric spacer, in accordance with another embodiment of the present invention. FIG. 4 also illustrates formation of a filament in a CBRAM element, in accordance with an embodiment of the present invention.

Referring to FIG. 4, the CBRAM element of part (c) of FIG. 3 is illustrated following formation of a sidewall spacer 199 along the sidewalls of the CBRAM element. As such, in one embodiment, a dielectric sidewall spacer 199 is formed laterally adjacent to and in contact with sidewalls of the active electrode layer 104, the second electrolyte material layer 108 of the resistance switching layer 106, the first electrolyte material layer 110 of the resistance switching layer 106, and the passive electrode layer 112 of the CBRAM element. In one such embodiment, the sidewalls of the CBRAM element are formed during a subtractive etching of the materials of the CBRAM stack shown in part (c) of FIG. 3. In one such embodiment, the dielectric sidewall spacer 199 formation includes conformal deposition of a dielectric material, such as a silicon nitride layer, and subsequent anisotropic etching to form the dielectric sidewall spacer 199.

Referring again to FIG. 4, the CBRAM element of part (c) of FIG. 3 is illustrated following formation of a filament 114, e.g., by an electrical forming process described in greater detail below in association with FIGS. 9A and 9B. In an embodiment, only a single filament 114 is formed. In an embodiment, the filament 114 is laterally centralized within the second electrolyte material layer 108 and the first electrolyte material layer 110 of the resistance switching layer 106. In an embodiment, only a single filament 114 is formed and is laterally centralized within the second electrolyte material layer 108 and the first electrolyte material layer 110 of the resistance switching layer 106. Referring again to FIG. 4, in an embodiment, the dielectric sidewall spacer 199 is formed prior to forming the filament 114. In another embodiment, the dielectric sidewall spacer 199 is formed subsequent to forming the filament 114.

It is to be appreciated that a CBRAM element 100 (or CBRAM element 120) may be fabricated on a conductive interconnect formed in an inter-layer dielectric (ILD) layer. As an example, FIG. 5A illustrates a cross-sectional view of two CBRAM devices, in accordance with an embodiment of the present invention.

Figure 5A:
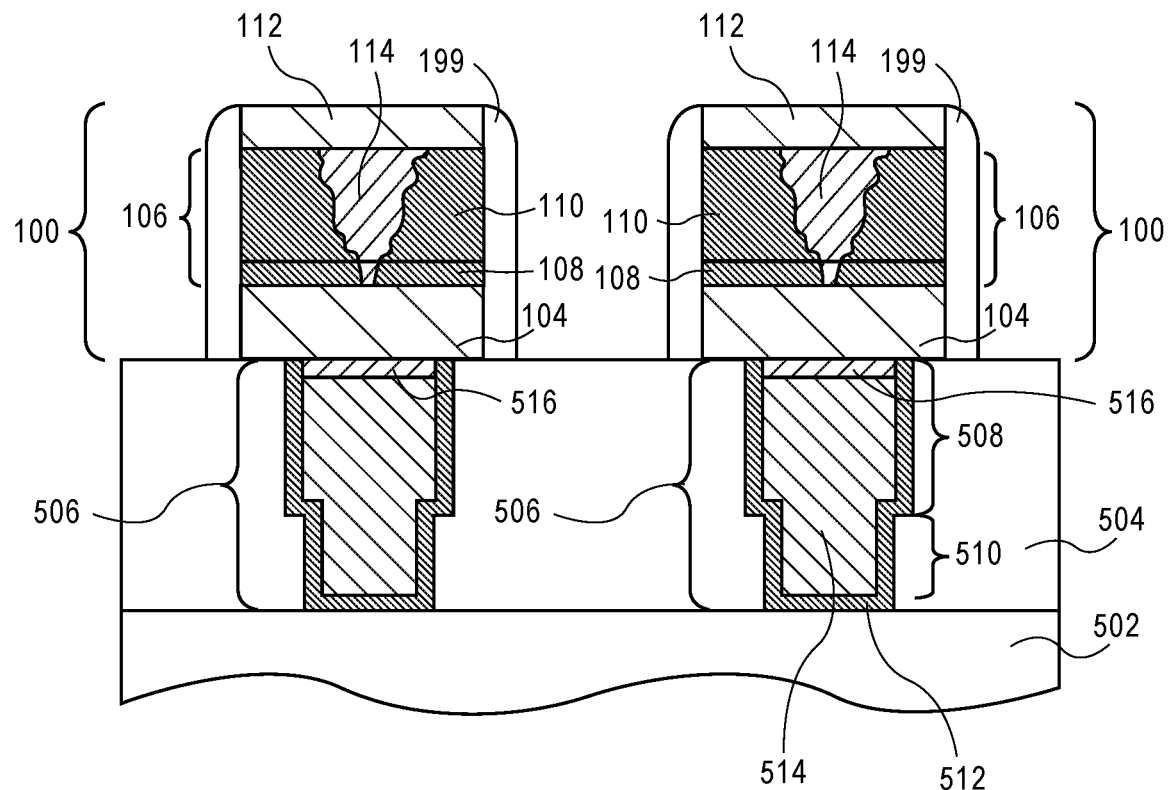
FIG. 5A illustrates a cross-sectional view of two CBRAM devices, in accordance with an embodiment of the present invention.

Referring to FIG. 5A, each of the CBRAM devices includes a conductive interconnect 506 disposed in an inter-layer dielectric (ILD) layer 504 disposed above a substrate 502. The ILD layer 506 may have an uppermost surface substantially co-planar with an uppermost surface of the conductive interconnect 506. A CBRAM element 100 is disposed on each of the conductive interconnects 506. Each CBRAM element 100 may include the material layers described in association with FIG. 1, as is depicted in FIG. 5A. It is to be appreciated that in other embodiments, each CBRAM element includes the material layers described in association with CBRAM element 120 of FIG. 2.

In an embodiment, the conductive interconnect 506 includes a conductive line portion 508 and an underlying via portion 510, as is depicted in FIG. 5A. In another embodiment, the conductive interconnect is a conductive via. In one embodiment, the conductive interconnect includes a conductive fill material 514 surrounded by a barrier layer 512, which may include an upper barrier layer 516, as is depicted in FIG. 5A. In a specific such embodiment, the conductive fill material 514 but not the barrier layer 512 is recessed to form an opening in which the upper barrier layer 516 is then formed. In an embodiment, although depicted using different shading, the upper barrier layer 516 is composed of substantially the same material as barrier layer. In one such embodiment, the material includes tantalum nitride.

Referring again to FIG. 5A, in an embodiment, the materials of the memory (CBRAM) elements are patterned following a deposition process such as described in association with FIG. 3. In one such embodiment, the material layers are patterned using a subtractive etching process. As depicted in FIG. 5A, a dielectric sidewall spacer 199 is laterally adjacent to and in contact with sidewalls of the patterned material layers of stacks 100, as described in association with FIG. 4. In one such embodiment, the dielectric sidewall spacer 199 is formed laterally adjacent to and in contact with sidewalls of an active electrode layer 104, a resistance switching layer 106 which includes a first electrolyte material layer 110 and a second electrolyte material layer 108, and a passive electrode layer 112, as is depicted in FIG. 5A.

Referring again to FIG. 5A, and as used throughout the present disclosure, in an embodiment, one or more interlayer dielectrics (ILDs), such as ILD layer 504, are included in a CBRAM device structure. Such ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. In cases where a stack of ILD layers is implemented, etch stop materials may be included as intervening dielectric layers between the ILD layers. Such etch stop layers may be composed of dielectric materials different from the interlayer dielectric material. In some embodiments, an etch stop layer includes a layer of a nitride of silicon (e.g., silicon nitride) or a layer of an oxide of silicon, or both, or a combination thereof. Other suitable materials may include carbon-based materials, such as silicon carbide. Alternatively, other etch stop layers known in the art may be used depending upon the particular implementation. The etch stop layers may be formed by CVD, PVD, or by other deposition methods.

Referring again to FIG. 5A, and as used throughout the present disclosure, in an embodiment, the metal lines (such as 508) and vias (such as 510) are composed of one or more metal or other conductive structures. A common example is the use of copper lines and structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

Referring again to FIG. 5A, and as used throughout the present disclosure, in an embodiment, substrate 502 is a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

Thus, it is to be appreciated that the layers and materials described in association with FIG. 1, 2, 4 or 5A, and as used throughout the present disclosure, are typically formed on or above an underlying semiconductor substrate or structure, such as underlying device layer(s) of an integrated circuit. In an embodiment, an underlying semiconductor substrate 102 or 502 represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. In one embodiment, the illustrated structure depicted in FIG. 1, 2, 4 or 5A is fabricated on underlying transistor or other semiconductor device layer(s) formed in or above the substrate 102 or 502. In another embodiment, the illustrated structures depicted in FIG. 1, 2, 4 or 5A are fabricated on underlying lower level interconnect layers formed above the substrate 102 or 502, respectively.

In an aspect, CBRAM elements 100 may be formed on a common conductive line. As an example, FIG. 5B illustrates a plan view of a pair of CBRAM elements integrated with a common line electrode, in accordance with an embodiment of the present invention.

Figure 5B:
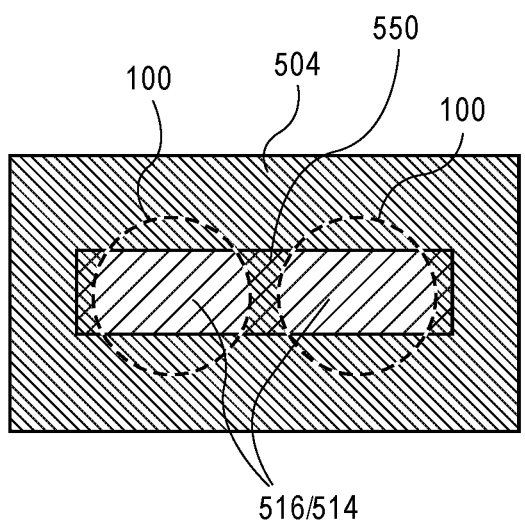
FIG. 5B illustrates a plan view of a pair of CBRAM elements integrated with a common line electrode, in accordance with an embodiment of the present invention.

Referring to FIG. 5B, a conductive interconnect 550 housed in an ILD layer 504 includes two CBRAM stacks 100 thereon (e.g., stacks including layers described in association with FIG. 1). Each CBRAM stack 100 is disposed on a portion of an upper barrier layer 516 or a conductive fill material 514 of the conductive interconnect. The conductive interconnect in this example is a conductive line coupled to a first and second CBRAM stacks 100. It is to be appreciated that in other embodiments, each CBRAM element includes the material layers described in association with CBRAM element 120 of FIG. 2.

In another aspect, adjacent CBRAM elements 100 may be formed on respective conductive vias. As an example, FIG. 5C illustrates a plan view of a pair of CBRAM elements integrated with discrete via electrodes, in accordance with an embodiment of the present invention.

Figure 5C:
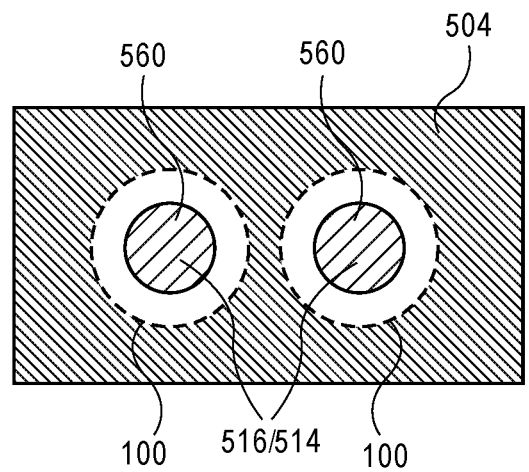
FIG. 5C illustrates a plan view of a pair of CBRAM elements integrated with discrete via electrodes, in accordance with an embodiment of the present invention.

Referring to FIG. 5C, a pair of conductive vias 560 housed in an ILD layer 504 each has a respective CBRAM stack 100 thereon (e.g., stacks including layers described in association with FIG. 1). Each via is discrete and includes an exposed upper barrier layer 516 or conductive fill material 514, on which a corresponding CBRAM stack 100 is disposed. It is to be appreciated that in other embodiments, each CBRAM element includes the material layers described in association with CBRAM element 120 of FIG. 2.

The above described CBRAM material stacks may be fabricated through subtractive patterning of the layers of the CBRAM stack 100 materials, as is depicted in the examples above. In another aspect, however, the layers of a CBRAM element may be fabricated in a damascene-like fabrication scheme. As an example, FIG. 6 illustrates a cross-sectional view of a conductive bridge random access memory (CBRAM) device fabricated using a damascene process, in accordance with an embodiment of the present invention.

Figure 6:
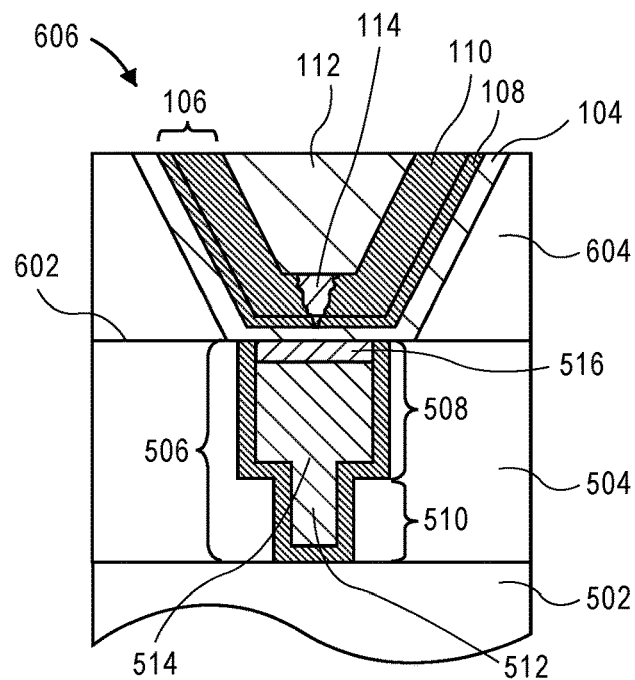
FIG. 6 illustrates a cross-sectional view of a conductive bridge random access memory (CBRAM) device fabricated using a damascene process, in accordance with an embodiment of the present invention.

Referring to FIG. 6, a conductive bridge random access memory (CBRAM) device includes a conductive interconnect 506 (e.g., one such interconnect described in association with FIG. 5A) disposed in a first inter-layer dielectric (ILD) layer 504 disposed above a substrate 502. A second ILD layer 604 is disposed above the first ILD layer 504. The second ILD layer 604 has an opening exposing the conductive interconnect 506 from a top down perspective. The opening has sidewalls, for example the sloped sidewalls depicted in FIG. 6.

A CBRAM element 606 is disposed on the conductive interconnect 506. The CBRAM element 606 includes an active electrode layer 104, a resistance switching layer 106 including a first electrolyte material layer 110 and a second electrolyte material layer 108, and a passive electrode layer 112. In one embodiment, the second ILD layer 604 is disposed directly on an uppermost surface 602 of the first ILD layer 504, as is depicted in FIG. 6. In another embodiment, an etch stop layer is disposed between the first ILD layer 504 and the second ILD layer 604.

Referring again to FIG. 6, in an embodiment, a damascene process is used in which the materials of the CBRAM element 606 are deposited conformal with an opening in a dielectric layer. The materials of the CBRAM element are then planarized, e.g., by chemical mechanical polishing, to form the CBRAM element 606. In one embodiment, following or prior to planarization, a filament 114 is formed in the second electrolyte material layer 108 and in the first electrolyte material layer 110 of the resistance switching layer 106, as is depicted in FIG. 6.

In another aspect, a conductive interconnect of an associated CBRAM element stack may be coupled to a drain region of an underlying select transistor disposed on a substrate. As an example, FIG. 7 illustrates a cross-sectional view of a conductive bridge random access memory (CBRAM) element coupled to a drain side of a transistor selector, in accordance with an embodiment of the present invention.

Figure 7:
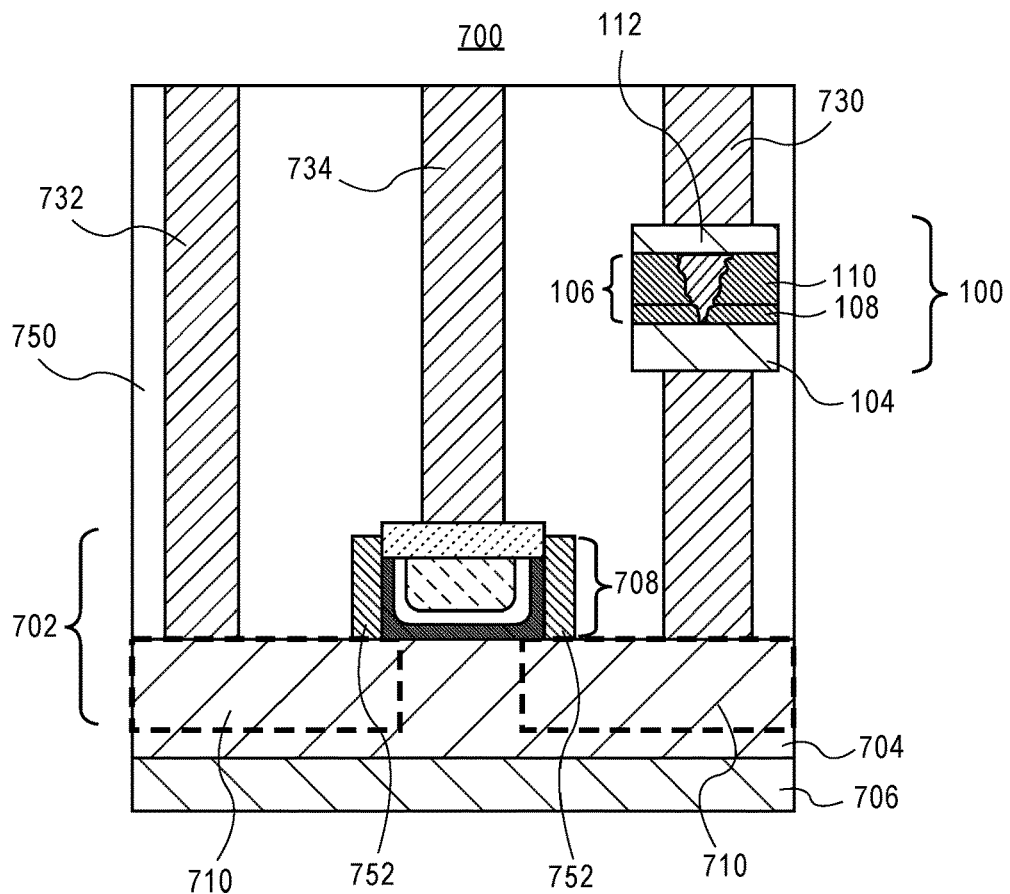
FIG. 7 illustrates a cross-sectional view of a conductive bridge random access memory (CBRAM) element coupled to a drain side of a transistor selector, in accordance with an embodiment of the present invention.

Referring to FIG. 7, a memory structure 700 includes a transistor 702 disposed in or above an active region 704 of a semiconductor substrate 706. The transistor 702 includes a gate electrode 708 with source/drain regions 710 on either side of the gate electrode 708, and in active region 704 of substrate 706. In an embodiment, the source/drain region 710 on the left-hand side of FIG. 7 is a source region, and the source/drain region 710 on the right-hand side of FIG. 7 is a drain region. A CBRAM element 100 is coupled to the drain region of the transistor 702, but not to the source region of the transistor 702. The arrangement enables driving of the CBRAM element 100 by the drain side only. The CBRAM element 100 and portions of the transistor 702 may be included in an inter-layer dielectric (ILD) layer 750, as is depicted in FIG. 7.

The CBRAM element 100 includes an active electrode layer 104, a resistance switching layer including a first electrolyte material layer 110 and a second electrolyte material layer 108, and a passive electrode layer 112. It is to be appreciated that in other embodiments, the CBRAM element includes the material layers described in association with CBRAM element 120 of FIG. 2. In either case, the CBRAM element is, in an embodiment, included as an interrupting feature along a conductive drain contact 730. In one such embodiment, corresponding gate contact 734 and source contact 732 are not coupled to, or interrupted by the CBRAM element 100, as is depicted in FIG. 7. It is to be appreciated that although the CBRAM element 100 is shown generically along the drain contact 730 without a lateral reference, the actual layer in which the CBRAM element 100 is included may be viewed as an interconnect layer (e.g., M1, M2, M3, M4, etc.) corresponding to a logic region in another area of the substrate 706. It is also to be appreciated that additional interconnect layer(s) may be formed on top of the structure 700 shown in FIG. 7, e.g., using standard dual damascene process techniques that are well-known in the art.

In an embodiment, transistor 702 is a metal-oxide-semiconductor field-effect transistor (MOSFET or simply MOS transistor), fabricated on a substrate. In various implementations of the invention, the MOS transistors described herein may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer of each MOS transistor is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers 752 may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

To provide further context, integrating memory directly onto a microprocessor chip would be advantageous since it enables higher operation speeds compared to having physically separate logic and memory chips. Unfortunately, traditional charge-based memory technologies such as DRAM and NAND Flash are now facing severe scalability issues related to increasingly precise charge placement and sensing requirements. As such, embedding charge-based memory directly onto a high performance logic chip is not very attractive for future technology nodes. However, a memory technology that does have the potential to scale to much smaller geometries compared to traditional charge-based memories is conductive bridge random access memory (CBRAM), since it relies on resistivity rather than charge as the information carrier. However, in order to exploit the potential benefits of a high performance logic chip with embedded CBRAM memory, an appropriate integrated logic plus CBRAM structure and fabrication method is needed. Embodiments of the present invention include such structures and fabrication processes.

Relating to one or more embodiments described herein, it is to be appreciated that traditional DRAM memory is facing severe scaling issues and, so, other types of memory devices are being actively explored in the electronics industry. One future contender is CBRAM devices. Embodiments described herein include a fabrication method for embedding CBRAM bit cell arrays into a logic process technology. Embodiments described may be advantageous for processing schemes involving the fabrication of logic processors with embedded memory arrays.

In another aspect, a CBRAM element may be included in an integrated circuit in regions typically referred to as back end or back end of line (BEOL) layers of the integrated circuit. As examples, FIGS. 8A-8E illustrate schematic views of several options for positioning an CBRAM element in an integrated circuit, in accordance with embodiments of the present invention.

Referring to all FIGS. 8A-8E, in each case, a memory region 800 and a logic region 802 of an integrated circuit are depicted schematically. Each memory region 800 includes a select transistor 804 and overlying alternating metal lines and vias. Each logic region includes a plurality of transistors 806 and overlying alternating metal lines and vias which can be used to connect the plurality of transistors 806 into functional circuits, as is well known in the art.

Referring to FIG. 8A, a CBRAM device 820 is disposed between a lower conductive via 822 and an upper conductive line 824. In one embodiment, the lower conductive via 822 is in electrical contact with a bottom electrode of the CBRAM device 820 (e.g., active electrode 104 or passive electrode 112), and the upper conductive line 824 is in electrical contact with a top electrode of the CBRAM device 820 (e.g., passive electrode 112 or active electrode 104, respectively). In a specific embodiment, the lower conductive via 822 is in direct contact with a bottom electrode of the CBRAM device 820, and the upper conductive line 824 is in direct contact with a top electrode of the CBRAM device 820.

Referring to FIG. 8B, a CBRAM device 830 is disposed between a lower conductive line 832 and an upper conductive via 834. In one embodiment, the lower conductive line 832 is in electrical contact with a bottom electrode of the CBRAM device 830 (e.g., active electrode 104 or passive electrode 112), and the upper conductive via 834 is in electrical contact with a top electrode of the CBRAM device 830 (e.g., passive electrode 112 or active electrode 104, respectively). In a specific embodiment, the lower conductive line 832 is in direct contact with a bottom electrode of the CBRAM device 830, and the upper conductive via 834 is in direct contact with a top electrode of the CBRAM device 830.

Referring to FIG. 8C, a CBRAM device 840 is disposed between a lower conductive line 842 and an upper conductive line 844 without an intervening conductive via. In one embodiment, the lower conductive line 842 is in electrical contact with a bottom electrode of the CBRAM device 840 (e.g., active electrode 104 or passive electrode 112), and the upper conductive line 844 is in electrical contact with a top electrode of the CBRAM device 840 (e.g., passive electrode 112 or active electrode 104, respectively). In a specific embodiment, the lower conductive line 842 is in direct contact with a bottom electrode of the CBRAM device 840, and the upper conductive line 844 is in direct contact with a top electrode of the CBRAM device 840.

Referring to FIG. 8D, a CBRAM device 850 is disposed between a lower conductive via 852 and an upper conductive via 854 without an intervening conductive line. In one embodiment, the lower conductive via 852 is in electrical contact with a bottom electrode of the CBRAM device 850 (e.g., active electrode 104 or passive electrode 112), and the upper conductive via 854 is in electrical contact with a top electrode of the CBRAM device 850 (e.g., passive electrode 112 or active electrode 104, respectively). In a specific embodiment, the lower conductive via 852 is in direct contact with a bottom electrode of the CBRAM device 850, and the upper conductive via 854 is in direct contact with a top electrode of the CBRAM device 850.

Referring to FIG. 8E, a CBRAM device 860 is disposed between a lower conductive line 862 and an upper conductive via 864 in place of an intervening conductive line and conductive via pairing. In one embodiment, the lower conductive line 862 is in electrical contact with a bottom electrode of the CBRAM device 860 (e.g., active electrode 104 or passive electrode 112), and the upper conductive via 864 is in electrical contact with a top electrode of the CBRAM device 860 (e.g., passive electrode 112 or active electrode 104, respectively). In a specific embodiment, the lower conductive line 862 is in direct contact with a bottom electrode of the CBRAM device 860, and the upper conductive via 864 is in direct contact with a top electrode of the CBRAM device 860.

Figure 8F:
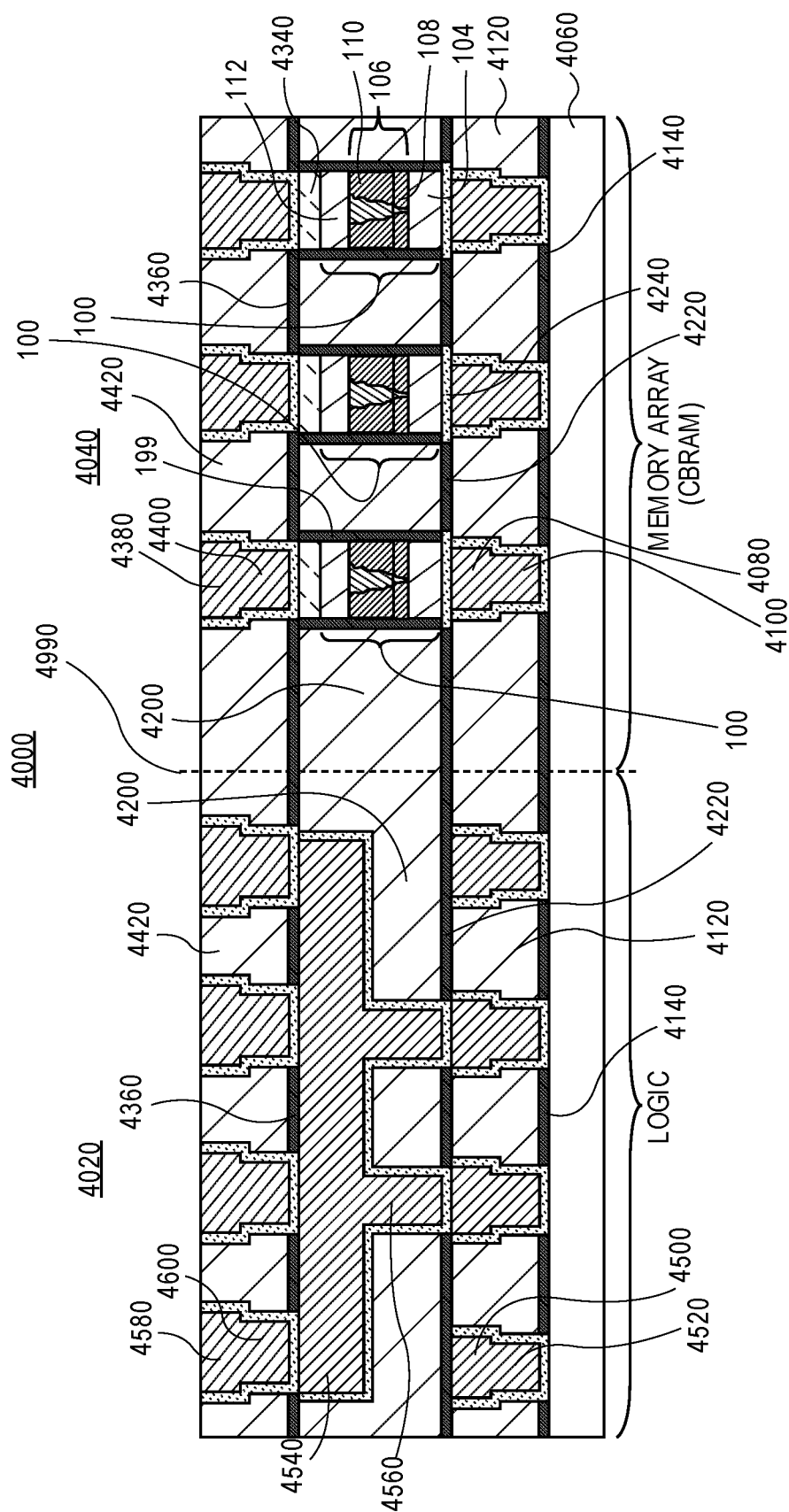
FIG. 8F illustrates a cross-sectional view of a logic region together with a conductive bridge random access memory (CBRAM) memory array integrated on a common substrate, in accordance with an embodiment of the present invention.

A CBRAM array may be embedded in a logic chip. As an example, FIG. 8F illustrates a cross-sectional view of a logic region together with a conductive bridge random access memory (CBRAM) memory array integrated on a common substrate, in accordance with an embodiment of the present invention. Referring to FIG. 8F, a structure 4000 includes a logic region 4020 and a CBRAM array region 4040.

Referring to the CBRAM array region 4040 of FIG. 8F, in a first layer, metal 2 (M2) 4080 and via 1 (V1) 4100 structures are formed above a substrate 4060. The M2 4080 and V1 4100 structures are formed in an inter-layer dielectric layer 4120 disposed over an etch stop layer 4140.

Referring again to the CBRAM array region 4040 of FIG. 8F, in a second layer, a plurality of CBRAM stacks 100 is formed in the inter-layer dielectric layer 4200 disposed over the etch stop layer 4220. The plurality of CBRAM stacks 100 may be coupled to corresponding ones of the M2 4080 structures by a conductive layer 4240, as is depicted in FIG. 8F. A dielectric spacer layer 199 may be formed on sidewalls of portions of the CBRAM stacks, as is also depicted in FIG. 8F. Each of the CBRAM stacks 100 includes an active electrode layer 104, a resistance switching layer 106 including a first electrolyte material layer 110 and a second electrolyte material layer 108, and a passive electrode layer 112. It is to be appreciated that in other embodiments, the CBRAM element includes the material layers described in association with CBRAM element 120 of FIG. 2. In either case, a top electrode or conductive hardmask 4340 may also be included, as is depicted in FIG. 8F.

Referring again to the CBRAM array region 4040 of FIG. 8F, in a third layer, an etch stop layer 4360 is disposed on the inter-layer dielectric layer 4200. Metal 4 (M4) 4380 and via to memory 4400 structures are formed in the inter-layer dielectric layer 4420 disposed over the etch stop layer 4360. It is to be appreciated that additional interconnect layer(s) may be formed on top of the M4/via to memory layers of the CBRAM array region 4040 of FIG. 8F, e.g., using standard dual damascene process techniques that are well-known in the art.

It is to be appreciated that although the CBRAM stacks may actually include numerous layers of very thin films, for the sake of simplicity the CBRAM stacks 100 are depicted as describe above. It is also to be appreciated that although in the illustrations the CBRAM stacks are shown embedded into a corresponding logic metal 3 (M3) layer, they may instead be embedded into some other interconnect layer (e.g., M1, M2, M4; etc.)

Referring again to FIG. 8F, in an embodiment, the conductive metal layer 4240 is a tantalum nitride (TaN) layer. In one embodiment, the conductive metal layer 4240 is referred to as a "thin via" layer. In an embodiment, the top electrode 4340 is composed of a material or stack of materials suitable for electrically contacting the CBRAM stack 100. In an embodiment, the top electrode 4340 is a topographically smooth electrode. In one such embodiment, the top electrode 4340 has a thickness suitable for good conductivity but has little to no columnar structure formation that would otherwise lead to a rough top surface. Such a topographically smooth electrode may be referred to as amorphous in structure. In an embodiment, the top electrode 4340 begins as a hardmask layer, such as a titanium nitride hardmask layer, used for patterning the CBRAM stack and is ultimately retained as a conductive contact.

Referring now to the logic region 4020 of FIG. 8F, in the first layer, metal 2 (M2) 4500 and via 1 (V1) 4520 structures are formed in the inter-layer dielectric layer 4120 disposed over the etch stop layer 4140. In the second layer, the etch stop layer 4220 is disposed on the inter-layer dielectric layer 4120. Metal 3 (M3) 4540 and via 2 (V2) 4560 structures are formed in the inter-layer dielectric layer 4200 disposed over the etch stop layer 4220. In the third layer, the etch stop layer 4360 is disposed on the inter-layer dielectric layer 4200. Metal 4 (M4) 4580 and via 3 (V3) 4600 structures are formed in the inter-layer dielectric layer 4420 disposed over the etch stop layer 4360. It is to be appreciated that additional interconnect layer(s) may be formed on top of the M4/V3 layers of the logic region 4020 of FIG. 8F, e.g., using standard dual damascene process techniques that are well-known in the art.

In another aspect, upon fabrication of a CBRAM element, the CBRAM may be subjected to an intentional one-time "break-down" process for filament formation in the resulting CBRAM device fabricated from the CBRAM memory element, e.g., to form filament 114 of FIG. 1 or filament 124 of FIG. 2. To illustrate the above aspect, FIGS. 9A and 9B illustrate a schematic and corresponding I-V plot, respectively, demonstrating concepts involved with filament formation in a conductive bridge random access memory (CBRAM) element, in accordance with an embodiment of the present invention.

Figure 9A:
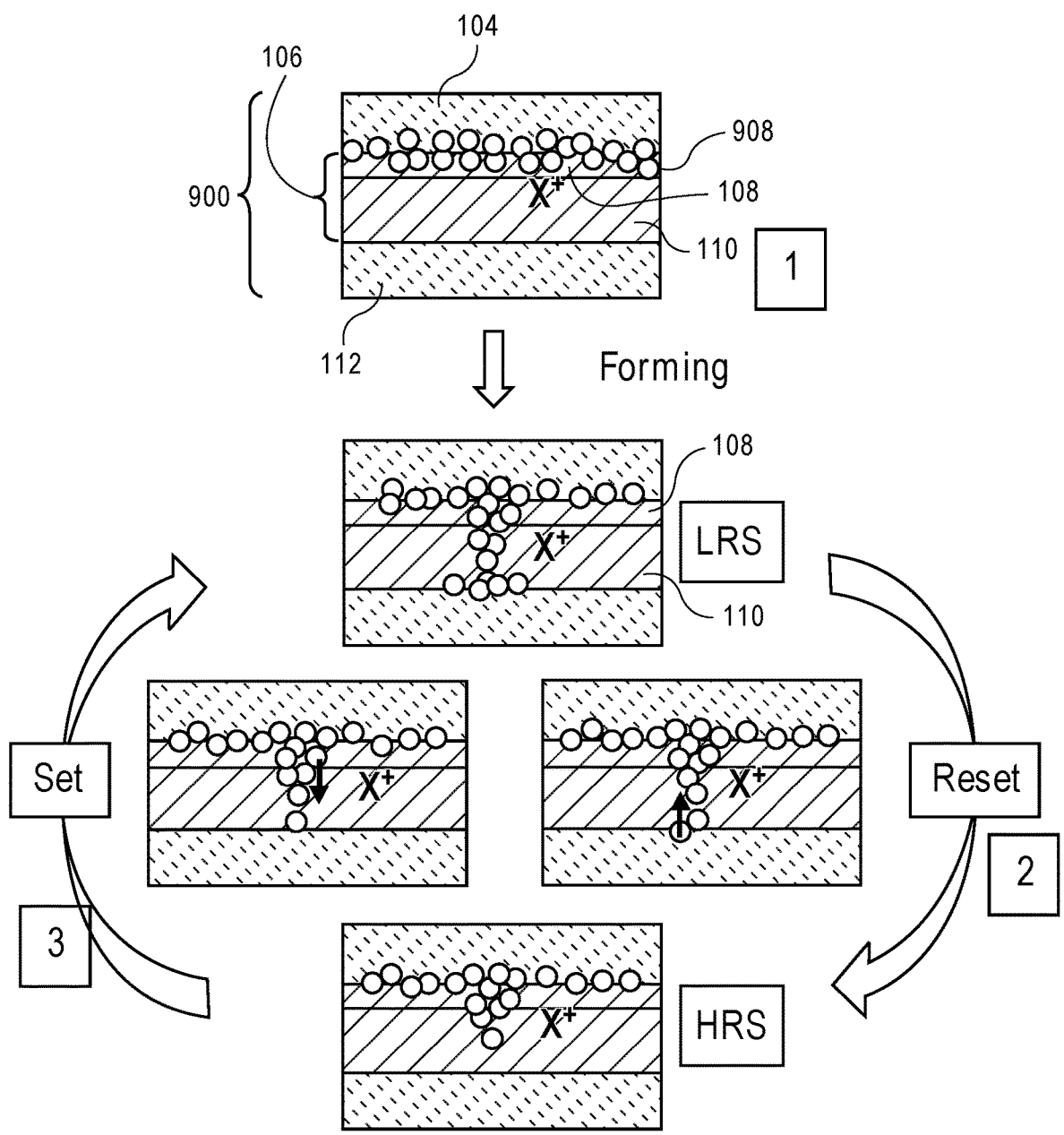
FIGS. 9A and 9B illustrate a schematic and corresponding I-V plot, respectively, demonstrating concepts involved with filament formation in a conductive bridge random access memory (CBRAM) element, in accordance with an embodiment of the present invention.
Figure 9B:
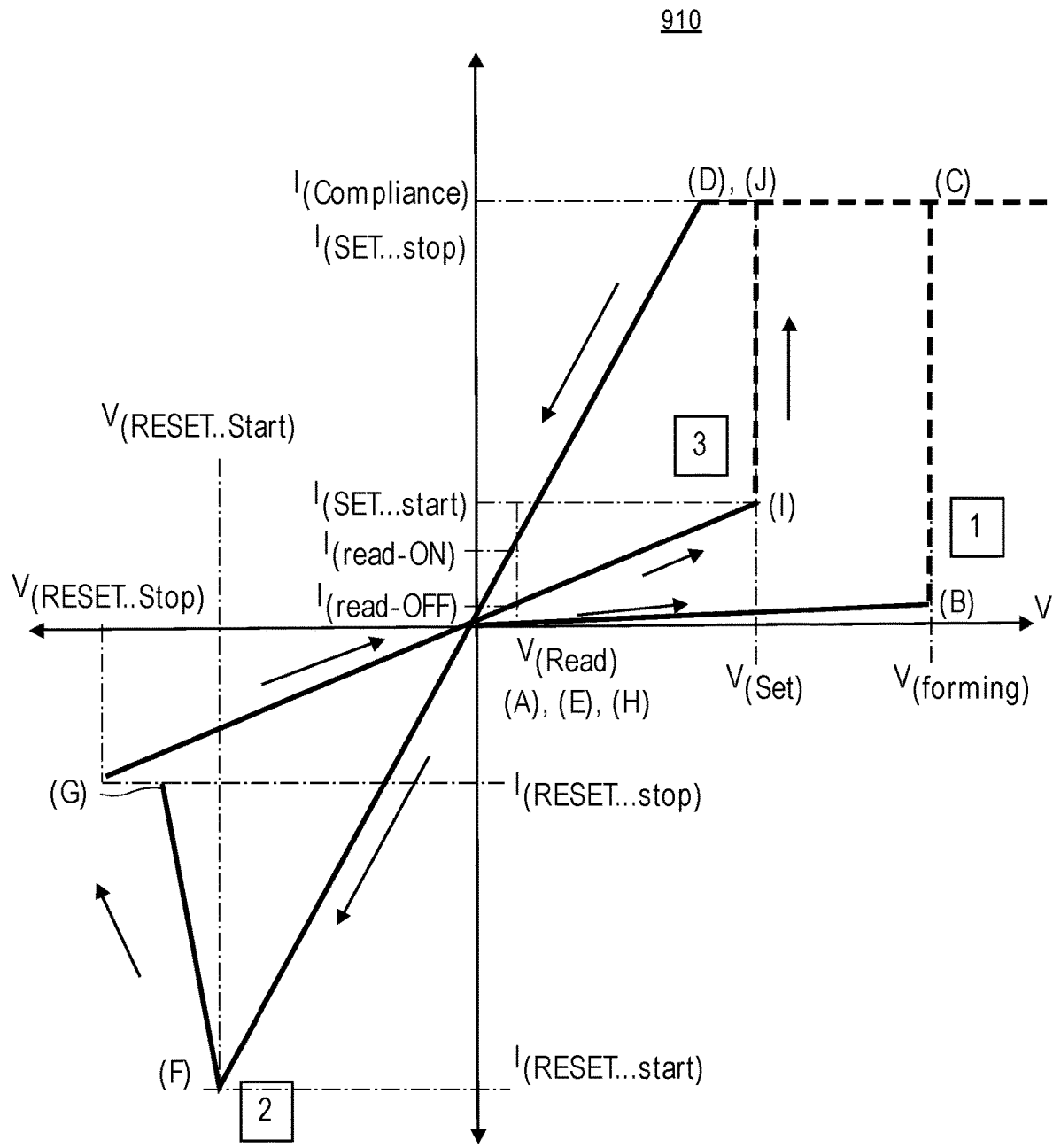

Referring to FIG. 9A, a material stack 900 includes a passive electrode 112, a switching layer 106 including a first electrolyte material layer 110 and a second electrolyte material layer (sub-layer) 108, and an active electrode 104.

Conductive bridge RAM cell filament formation begins with a forming (soft breakdown) operation (1) to provide a low resistance state (LRS). A first reset operation (2) is then performed to provide switching to a high resistance state (HRS). A set operation (3) is then performed to return to the LRS. Performing operations (1)-(3) involves motion of metal ions and redox phenomena. Plot 910 of FIG. 9B illustrates the I-V characteristics association with operations (1), (2) and (3) of FIG. 9A.

Figure 10:
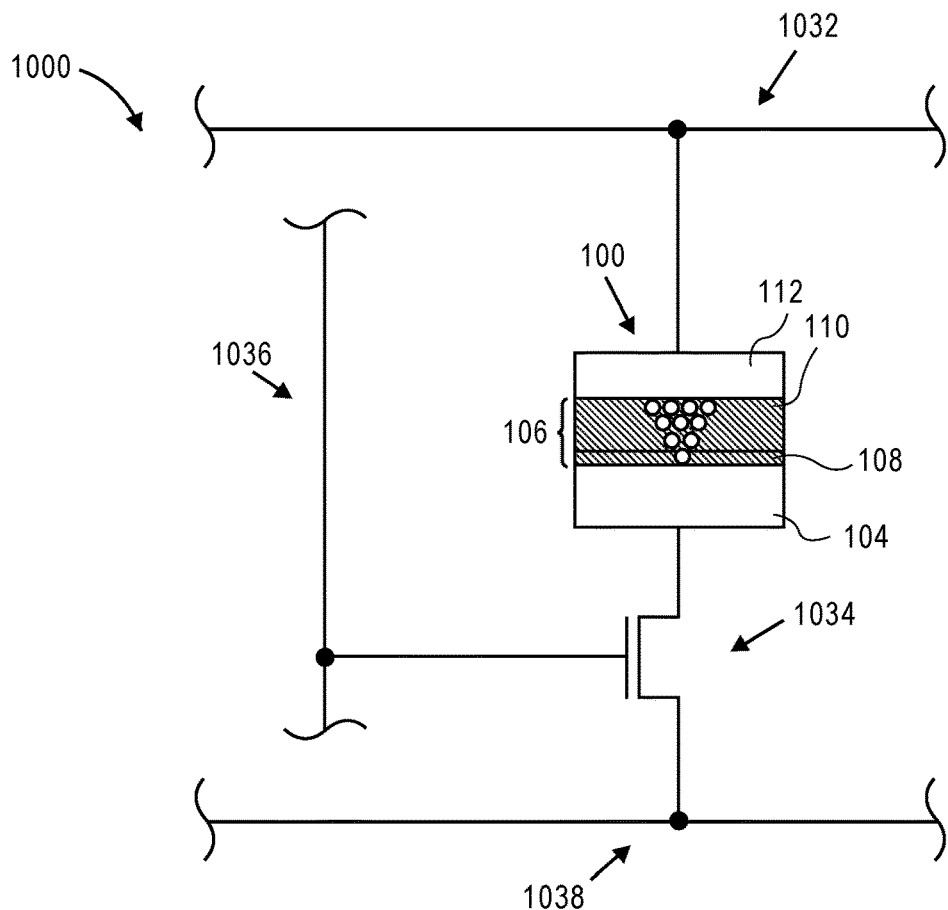
FIG. 10 illustrates a schematic of a memory bit cell which includes a CBRAM memory element, in accordance with an embodiment of the present invention.

It is to be appreciated that a CBRAM material stack may be used to fabricate a memory bit cell. For example, FIG. 10 illustrates a schematic of a memory bit cell 1000 which includes a conductive bridge random access memory (CBRAM) memory element 100, in accordance with an embodiment of the present invention. Such a CBRAM memory element may be suitable for manufacture on a substrate in common with logic regions of the substrate.

Referring to FIG. 10, the CBRAM memory element 100 includes an active electrode 104 with resistance switching layer 106 above the active electrode 104. A passive electrode 112 is above the resistance switching layer 106. It is to be appreciated that in other embodiments, the CBRAM element includes the material layers described in association with CBRAM element 120 of FIG. 2, i.e., the material stack would be inverted.

The passive electrode 112 may be electrically connected to a bit line 1032. The active electrode 104 may be coupled with a transistor 1034. The transistor 1034 may be coupled with a wordline 1036 and a source line 1038 in a manner that will be understood to those skilled in the art. The memory bit cell 1000 may further include additional read and write circuitry (not shown), a sense amplifier (not shown), a bit line reference (not shown), and the like, as will be understood by those skilled in the art, for the operation of the memory bit cell 1000. It is to be appreciated that a plurality of the memory bit cells 1000 may be operably connected to one another to form a memory array, where the memory array can be incorporated into a non-volatile memory region of a substrate in common with a logic region. It is to be appreciated that the transistor 1034 may be connected to the passive electrode 112 or the active electrode 104, although only the latter is shown. Likewise, bit line 1032 may be connected to the active electrode 104 or the passive electrode 112, although only the latter is shown.

Figure 11:
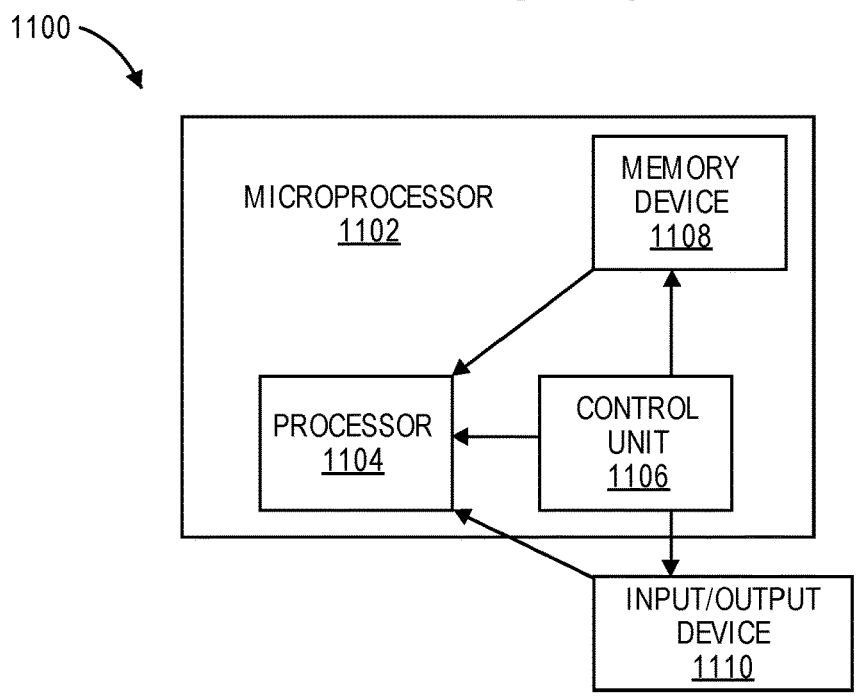
FIG. 11 illustrates a block diagram of an electronic system, in accordance with an embodiment of the present invention.

FIG. 11 illustrates a block diagram of an electronic system 1100, in accordance with an embodiment of the present invention. The electronic system 1100 can correspond to, for example, a portable system, a computer system, a process control system, or any other system that utilizes a processor and an associated memory. The electronic system 1100 may include a microprocessor 1102 (having a processor 1104 and control unit 1106), a memory device 1108, and an input/output device 1110 (it is to be appreciated that the electronic system 1100 may have a plurality of processors, control units, memory device units and/or input/output devices in various embodiments). In one embodiment, the electronic system 1100 has a set of instructions that define operations which are to be performed on data by the processor 1104, as well as, other transactions between the processor 1104, the memory device 1108, and the input/output device 1110. The control unit 1106 coordinates the operations of the processor 1104, the memory device 1108 and the input/output device 1110 by cycling through a set of operations that cause instructions to be retrieved from the memory device 1108 and executed. The memory device 1108 can include a memory element as described in the present description. In an embodiment, the memory device 1108 is embedded in the microprocessor 1102, as depicted in FIG. 11. In an embodiment, the processor 1104, or another component of electronic system 1100, includes an array of conductive bridge random access memory (CBRAM) devices, such as those described herein.

Figure 12:
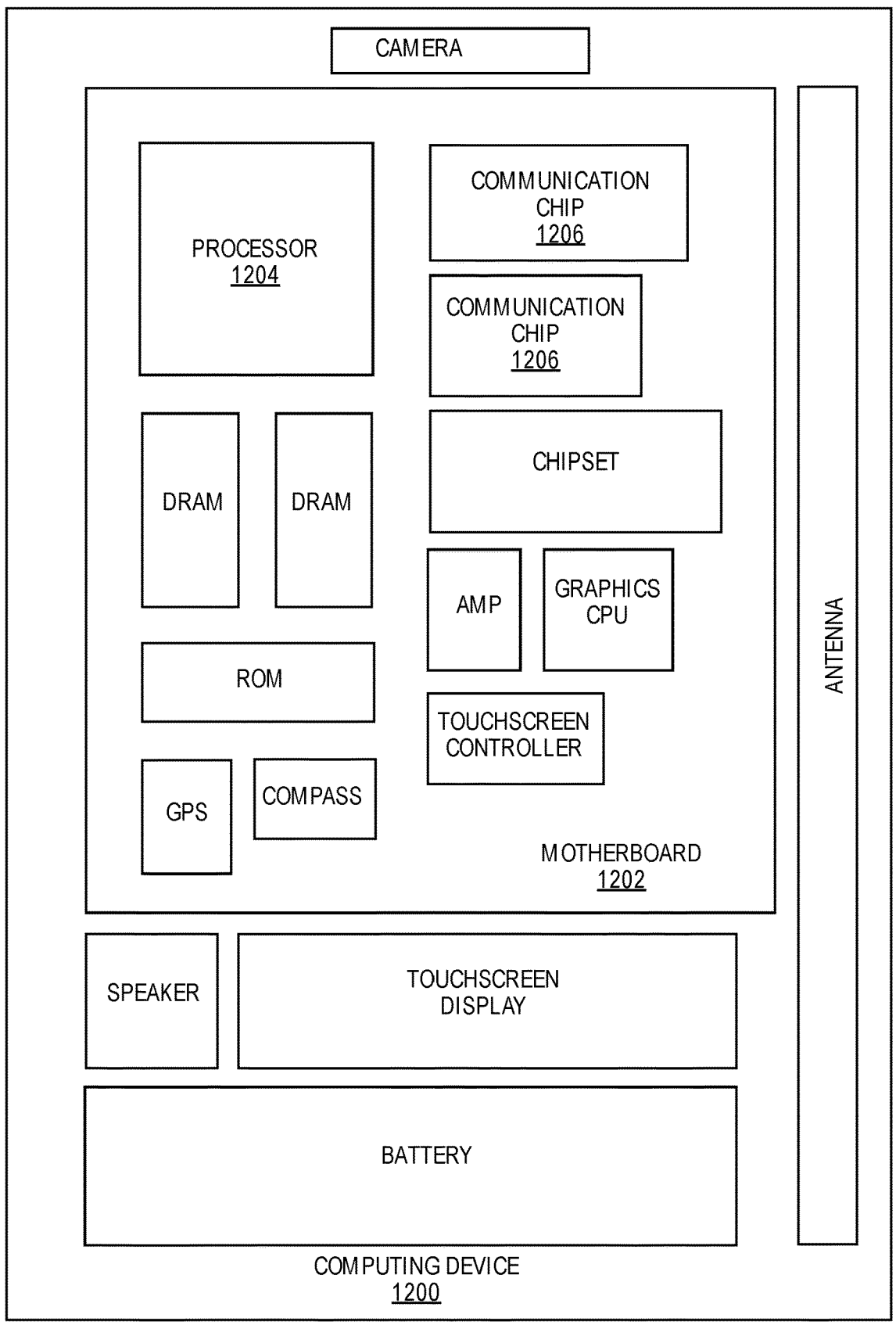
FIG. 12 illustrates a computing device in accordance with one embodiment of the invention.

FIG. 12 illustrates a computing device 1200 in accordance with one embodiment of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 8.02.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some implementations of embodiments of the invention, the integrated circuit die of the processor includes one or more arrays, such as conductive bridge random access memory (CBRAM) memory arrays integrated into a logic processor, built in accordance with embodiments of the present invention. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of an embodiment of the invention, the integrated circuit die of the communication chip includes conductive bridge random access memory (CBRAM) memory arrays integrated into a logic processor, built in accordance with embodiments of the present invention.

In further implementations, another component housed within the computing device 1200 may contain a stand-alone integrated circuit memory die that includes one or more arrays, such as conductive bridge random access memory (CBRAM) memory arrays integrated into a logic processor, built in accordance with embodiments of the present invention.

In various implementations, the computing device 1200 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Accordingly, one or more embodiments of the present invention relate generally to the fabrication of embedded microelectronic memory. The microelectronic memory may be non-volatile, where the memory can retain stored information even when not powered. One or more embodiments of the present invention relate to the fabrication of conductive bridge random access memory (CBRAM) memory arrays integrated into a logic processor. Such arrays may be used in an embedded non-volatile memory, either for its non-volatility, or as a replacement for embedded dynamic random access memory (eDRAM). For example, such an array may be used for 1T-1R memory or 2T-1R memory (R=resistor) at competitive cell sizes within a given technology node.

Figure 13:
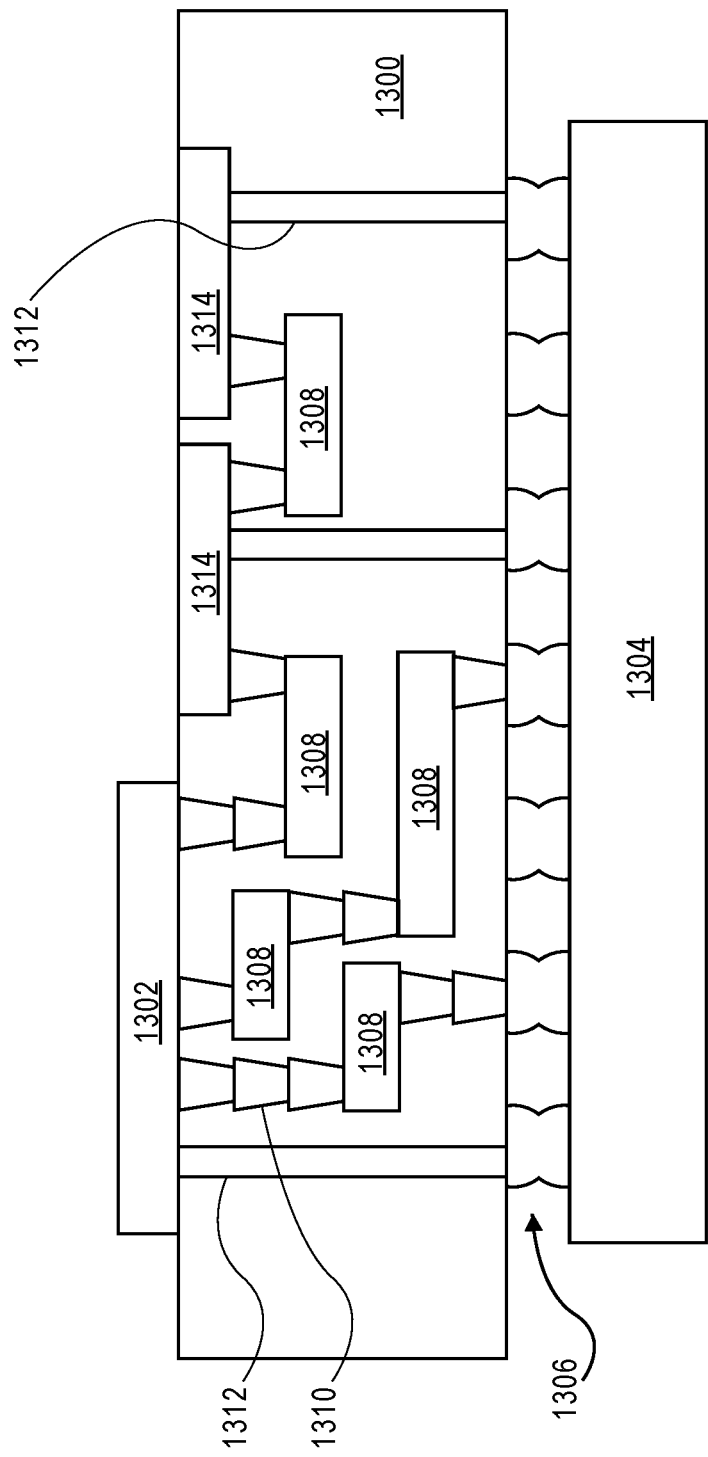
FIG. 13 illustrates an interposer that includes one or more embodiments of the invention.

FIG. 13 illustrates an interposer 1300 that includes one or more embodiments of the invention. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the invention, apparatuses or processes disclosed herein may be used in the fabrication of interposer 1300.

Thus, embodiments of the present invention include conductive bridge random access memory (CBRAM) devices with low thermal conductivity electrolyte sublayers.

Example Embodiment 1

A conductive bridge random access memory (CBRAM) device includes a conductive interconnect disposed in an inter-layer dielectric (ILD) layer disposed above a substrate. A CBRAM element is disposed on the conductive interconnect. The CBRAM element includes an active electrode layer disposed on the conductive interconnect, and a resistance switching layer disposed on the active electrode layer. The resistance switching layer includes a first electrolyte material layer disposed on a second electrolyte material layer, the second electrolyte material layer disposed on the active electrode layer and having a thermal conductivity lower than a thermal conductivity of the first electrolyte material layer. A passive electrode layer is disposed on the first electrolyte material of the resistance switching layer.

Example Embodiment 2

The CBRAM device of example embodiment 1, wherein the thermal conductivity of the second electrolyte material layer is at least approximately 25% less than the thermal conductivity of the first electrolyte material layer.

Example Embodiment 3

The CBRAM device of example embodiment 1 or 2, wherein the thermal conductivity of the second electrolyte material layer is less than 0.5 W/m/K, and the thermal conductivity of the first electrolyte material layer is greater than 0.5 W/m/K.

Example Embodiment 4

The CBRAM device of example embodiment 1, 2 or 3, wherein the resistance switching layer includes a seam between the first electrolyte material layer and the second electrolyte material layer.

Example Embodiment 5

The CBRAM device of example embodiment 1, 2, 3 or 4, wherein the first electrolyte material layer includes a chalcogenide material or a metal oxide material, and wherein the second electrolyte material layer includes a material selected from the group consisting of carbon-doped silicon oxide, a low density oxide, a porous oxide or a chalcogenide which includes a group 6 element selected from the group consisting of Te, Se, and S.

Example Embodiment 6

The CBRAM device of example embodiment 1, 2, 3, 4 or 5, wherein the first electrolyte material layer includes a hafnium oxide material, and wherein the second electrolyte material layer includes the oxide of hafnium having a lower density than the hafnium oxide material of the first electrolyte material layer.

Example Embodiment 7

The CBRAM device of example embodiment 1, 2, 3, 4, 5 or 6, wherein the first electrolyte material layer has a thickness greater than a thickness of the second electrolyte material layer.

Example Embodiment 8

The CBRAM device of example embodiment 1, 2, 3, 4, 5, 6 or 7, wherein the thickness of the first electrolyte material layer is approximately in the range of 3-5 nanometers, and wherein the thickness of the second electrolyte material layer is approximately in the range of 0.5-2 nanometers.

Example Embodiment 9

The CBRAM device of example embodiment 1, 2, 3, 4, 5, 6, 7 or 8, further including a filament disposed in the first electrolyte material layer and in the second electrolyte material layer of the resistance switching layer.

Example Embodiment 10

The CBRAM device of example embodiment 1, 2, 3, 4, 5, 6, 7, 8 or 9, wherein the active electrode layer includes a metal species selected from the group consisting of copper, silver, and lithium, and wherein the passive electrode layer includes a metal species selected from the group consisting of tungsten and platinum.

Example Embodiment 11

The CBRAM device of example embodiment 1, 2, 3, 4, 5, 6, 7, 8, 9 or 10, wherein the conductive interconnect is coupled to a drain region of an underlying select transistor disposed in or above the substrate.

Example Embodiment 12

A conductive bridge random access memory (CBRAM) device includes a conductive interconnect disposed in an inter-layer dielectric (ILD) layer disposed above a substrate. A CBRAM element is disposed on the conductive interconnect. The CBRAM element includes a passive electrode layer disposed on the conductive interconnect, and a resistance switching layer disposed on the passive electrode layer. The resistance switching layer includes a first electrolyte material layer disposed on a second electrolyte material layer, the second electrolyte material layer disposed on the passive electrode layer and having a thermal conductivity higher than a thermal conductivity of the first electrolyte material layer. An active electrode layer is disposed on the first electrolyte material of the resistance switching layer.

Example Embodiment 13

The CBRAM device of example embodiment 12, wherein the thermal conductivity of the first electrolyte material layer is at least approximately 25% less than the thermal conductivity of the second electrolyte material layer.

Example Embodiment 14

The CBRAM device of example embodiment 12 or 13, wherein the thermal conductivity of the first electrolyte material layer is less than 0.5 W/m/K, and the thermal conductivity of the second electrolyte material layer is greater than 0.5 W/m/K.

Example Embodiment 15

The CBRAM device of example embodiment 12, 13 or 14, wherein the resistance switching layer includes a seam between the first electrolyte material layer and the second electrolyte material layer.

Example Embodiment 16

The CBRAM device of example embodiment 12, 13, 14 or 15, wherein the second electrolyte material layer comprises a chalcogenide material or a metal oxide material, and wherein the first electrolyte material layer comprises a material selected from the group consisting of a carbon-doped silicon oxide, a low density oxide, a porous oxide, and a chalcogenide a chalcogenide which includes a group 6 element selected from the group consisting of Te, Se, and S.

Example Embodiment 17

The CBRAM device of example embodiment 12, 13, 14, 15 or 16, wherein the second electrolyte material layer comprises a hafnium oxide material, and wherein the first electrolyte material layer comprises the oxide of hafnium having a lower density than the hafnium oxide material of the second electrolyte material layer.

Example Embodiment 18

The CBRAM device of example embodiment 12, 13, 14, 15, 16 or 17, wherein the second electrolyte material layer has a thickness greater than a thickness of the first electrolyte material layer.

Example Embodiment 19

The CBRAM device of example embodiment 12, 13, 14, 15, 16, 17 or 18, wherein the thickness of the second electrolyte material layer is approximately in the range of 3-5 nanometers, and wherein the thickness of the first electrolyte material layer is approximately in the range of 0.5-2 nanometers.

Example Embodiment 20

The CBRAM device of example embodiment 12, 13, 14, 15, 16, 17, 18 or 19, further including a filament disposed in the first electrolyte material layer and in the second electrolyte material layer of the resistance switching layer.

Example Embodiment 21

The CBRAM device of example embodiment 12, 13, 14, 15, 16, 17, 18, 19 or 20, wherein the active electrode layer includes a metal species selected from the group consisting of copper, silver, and lithium, and wherein the passive electrode layer includes a metal species selected from the group consisting of tungsten and platinum.

Example Embodiment 22

The CBRAM device of example embodiment 12, 13, 14, 15, 16, 17, 18, 19, 20 or 21, wherein the conductive interconnect is coupled to a drain region of an underlying select transistor disposed in or above the substrate.

Example Embodiment 23

A method of fabricating a conductive bridge random access memory (CBRAM) device includes forming a conductive interconnect in an inter-layer dielectric (ILD) layer formed above a substrate, forming a first electrode layer on the conductive interconnect, and forming a resistance switching layer on the first electrode layer. The resistance switching layer includes a first electrolyte material layer and a second electrolyte material layer, the first electrolyte material layer having a thermal conductivity lower than a thermal conductivity of the second electrolyte material layer. The method also includes forming a second electrode layer on the resistance switching layer, and patterning the first electrode layer, the resistance switching layer, and the second electrode layer to form a CBRAM element.

Example Embodiment 24

The method of example embodiment 23, wherein forming the resistance switching layer includes forming the first electrolyte material layer using atomic layer deposition (ALD) or chemical vapor deposition (CVD), and forming the second electrolyte material layer using physical vapor deposition (PVD).

Example Embodiment 25

The method of example embodiment 23 or 24, further including applying a voltage cycling operation to form a filament in the first electrolyte material layer and in the second electrolyte material layer of the resistance switching layer.

What is claimed is:

1. A conductive bridge random access memory (CBRAM) device, comprising:
   a conductive interconnect disposed in an inter-layer dielectric (ILD) layer disposed above a substrate; and
   a CBRAM element disposed on the conductive interconnect, the CBRAM element comprising:
      an active electrode layer disposed on the conductive interconnect;
      a resistance switching layer disposed on the active electrode layer, the resistance switching layer comprising a first electrolyte material layer disposed on a second electrolyte material layer, the second electrolyte material layer disposed on the active electrode layer and having a thermal conductivity lower than a thermal conductivity of the first electrolyte material layer, wherein the first electrolyte material layer is separate and distinct from the second electrolyte material layer, wherein the first electrolyte material layer comprises oxygen and hafnium, and the second electrolyte material layer comprise oxygen and hafnium, and wherein the second electrolyte material layer has stoichiometrically less oxygen than the first electrolyte material layer; and
      a passive electrode layer disposed on the first electrolyte material of the resistance switching layer.

2. The CBRAM device of claim 1, wherein the thermal conductivity of the second electrolyte material layer is at least approximately 25% less than the thermal conductivity of the first electrolyte material layer.

3. The CBRAM device of claim 1, wherein the thermal conductivity of the second electrolyte material layer is less than 0.5 W/m/K, and the thermal conductivity of the first electrolyte material layer is greater than 0.5 W/m/K.

4. The CBRAM device of claim 1, wherein the resistance switching layer comprises a seam between the first electrolyte material layer and the second electrolyte material layer.

5. The CBRAM device of claim 1, wherein the second electrolyte material layer has a lower density than the first electrolyte material layer.

6. The CBRAM device of claim 1, wherein the first electrolyte material layer has a thickness greater than a thickness of the second electrolyte material layer.

7. The CBRAM device of claim 6, wherein the thickness of the first electrolyte material layer is approximately in the range of 3-5 nanometers, and wherein the thickness of the second electrolyte material layer is approximately in the range of 0.5-2 nanometers.

8. The CBRAM device of claim 1, further comprising:
   a filament disposed in the first electrolyte material layer and in the second electrolyte material layer of the resistance switching layer.

9. The CBRAM device of claim 1, wherein the active electrode layer comprises a metal species selected from the group consisting of copper, silver, and wherein the passive electrode layer comprises a metal species selected from the group consisting of tungsten and platinum.

10. The CBRAM device of claim 1, wherein the conductive interconnect is coupled to a drain region of an underlying select transistor disposed in or above the substrate.

11. A conductive bridge random access memory (CBRAM) device, comprising:
    a conductive interconnect disposed in an inter-layer dielectric (ILD) layer disposed above a substrate; and
    a CBRAM element disposed on the conductive interconnect, the CBRAM element comprising:
       a passive electrode layer disposed on the conductive interconnect;
       a resistance switching layer disposed on the passive electrode layer, the resistance switching layer comprising a first electrolyte material layer disposed on a second electrolyte material layer, the second electrolyte material layer disposed on the passive electrode layer and having a thermal conductivity higher than a thermal conductivity of the first electrolyte material layer, wherein the first electrolyte material layer is separate and distinct from the second electrolyte material layer, wherein the first electrolyte material layer comprises oxygen and hafnium, and the second electrolyte material layer comprise oxygen and hafnium, and wherein the first electrolyte material layer has stoichiometrically less oxygen than the second electrolyte material layer; and
       an active electrode layer disposed on the first electrolyte material of the resistance switching layer.

12. The CBRAM device of claim 11, wherein the thermal conductivity of the first electrolyte material layer is at least approximately 25% less than the thermal conductivity of the second electrolyte material layer.

13. The CBRAM device of claim 11, wherein the thermal conductivity of the first electrolyte material layer is less than 0.5 W/m/K, and the thermal conductivity of the second electrolyte material layer is greater than 0.5 W/m/K.

14. The CBRAM device of claim 11, wherein the resistance switching layer comprises a seam between the first electrolyte material layer and the second electrolyte material layer.

15. The CBRAM device of claim 11, wherein the first electrolyte material layer has a lower density than the second electrolyte material layer.

16. The CBRAM device of claim 11, wherein the second electrolyte material layer has a thickness greater than a thickness of the first electrolyte material layer.

17. The CBRAM device of claim 16, wherein the thickness of the second electrolyte material layer is approximately in the range of 3-5 nanometers, and wherein the thickness of the first electrolyte material layer is approximately in the range of 0.5-2 nanometers.

18. The CBRAM device of claim 11, further comprising:
a filament disposed in the first electrolyte material layer and in the second electrolyte material layer of the resistance switching layer.

19. The CBRAM device of claim 11, wherein the active electrode layer comprises a metal species selected from the group consisting of copper, silver, and wherein the passive electrode layer comprises a metal species selected from the group consisting of tungsten and platinum.

20. The CBRAM device of claim 11, wherein the conductive interconnect is coupled to a drain region of an underlying select transistor disposed in or above the substrate.

21. A method of fabricating a conductive bridge random access memory (CBRAM) device, the method comprising:
forming a conductive interconnect in an inter-layer dielectric (ILD) layer formed above a substrate;
forming a first electrode layer on the conductive interconnect;
forming a resistance switching layer on the first electrode layer, the resistance switching layer comprising a first electrolyte material layer and a second electrolyte material layer, the first electrolyte material layer having a thermal conductivity lower than a thermal conductivity of the second electrolyte material layer, wherein the first electrolyte material layer is separate and distinct from the second electrolyte material layer, wherein the first electrolyte material layer comprises oxygen and hafnium, and the second electrolyte material layer comprise oxygen and hafnium, and wherein the first electrolyte material layer has stoichiometrically less oxygen than the second electrolyte material layer;
forming a second electrode layer on the resistance switching layer; and
patterning the first electrode layer, the resistance switching layer, and the second electrode layer to form a CBRAM element.

22. The method of claim 21, wherein forming the resistance switching layer comprises forming the first electrolyte material layer using atomic layer deposition (ALD) or chemical vapor deposition (CVD), and forming the second electrolyte material layer using physical vapor deposition (PVD).

23. The method of claim 21, further comprising:
applying a voltage cycling operation to form a filament in the first electrolyte material layer and in the second electrolyte material layer of the resistance switching layer.

* * * * *